United States Patent
Fried et al.

(10) Patent No.: US 7,064,413 B2
(45) Date of Patent: Jun. 20, 2006

(54) FIN-TYPE RESISTORS

(75) Inventors: David M. Fried, Ithaca, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 111 days.

(21) Appl. No.: 10/774,773

(22) Filed: Feb. 9, 2004

(65) Prior Publication Data

US 2004/0159910 A1    Aug. 19, 2004

Related U.S. Application Data

(62) Division of application No. 09/683,625, filed on Jan. 28, 2002, now Pat. No. 6,720,231.

(51) Int. Cl.
*H01L 29/76*    (2006.01)
*H01L 29/94*    (2006.01)
*H01L 29/00*    (2006.01)
*H01L 27/108*   (2006.01)

(52) U.S. Cl. .................. 257/536; 257/308; 257/550; 257/542

(58) Field of Classification Search ........ 257/542–543, 257/536, 548–550, 308
See application file for complete search history.

(56) References Cited

U.S. PATENT DOCUMENTS

| | | |
|---|---|---|
| 3,798,753 A | 3/1974 | Camenzind et al. |
| 4,065,742 A | 12/1977 | Kendall et al. |
| 4,191,964 A | 3/1980 | Kant |
| 4,296,428 A | 10/1981 | Haraszti |
| 4,416,049 A | 11/1983 | McElroy |
| 4,743,565 A * | 5/1988 | Goth et al. .................. 438/327 |
| 4,825,081 A | 4/1989 | Wille et al. |
| 4,893,166 A | 1/1990 | Geekie |
| 5,102,812 A | 4/1992 | Caneau et al. |
| 5,172,211 A | 12/1992 | Godinho et al. |
| 5,287,377 A | 2/1994 | Fukuzawa et al. |
| 5,705,414 A | 1/1998 | Lustig |
| 5,916,821 A | 6/1999 | Kerber |
| 6,072,220 A | 6/2000 | Strack |
| 6,165,861 A | 12/2000 | Liu et al. |
| 6,165,862 A | 12/2000 | Ishikawa et al. |
| 6,297,533 B1 | 10/2001 | Mikhitarian |
| 6,300,180 B1 | 10/2001 | Chang et al. |
| 6,413,802 B1 * | 7/2002 | Hu et al. .................. 438/151 |
| 6,525,403 B1 * | 2/2003 | Inaba et al. .................. 257/618 |
| 6,545,297 B1 | 4/2003 | Noble et al. |

* cited by examiner (Continued)

OTHER PUBLICATIONS

Yan, et al. "Scaling the Si MOSFET: From Bulk to SOI to Bulk", IEEE Transactions on Electron Devices, vol. 39, No. 7, Jul. 1992 (pp. 1704-1710).

*Primary Examiner*—Chuong Anh Luu
(74) *Attorney, Agent, or Firm*—Scully, Scott, Murphy & Presser; William D. Sabo

(57) ABSTRACT

A method of forming a Fin structure including a resistor present in the thin vertically oriented semiconductor body is provided. The method includes the steps of forming at least one vertically-oriented semiconductor body having exposed vertical surfaces on a substrate; implanting dopant ions into the exposed vertical surfaces of the at least one semiconductor body off-axis at a concentration and energy sufficient to penetrate into the exposed vertical surfaces of the at least one semiconductor body without saturation; and forming contacts to the at least one semiconductor body. The present invention is directed to a Fin structure which includes a resistor present within the thin vertically oriented semiconductor body.

11 Claims, 7 Drawing Sheets

FIN-TYPE RESISTORS

CROSS-REFERENCE TO RELATED APPLICATION

This application is a divisional of U.S. application Ser. No. 09/683,625, filed Jan. 28, 2002 U.S. Pat. No. 6,720,231.

BACKGROUND OF THE INVENTION

1. Field of the Invention

The present invention relates to semiconductor device manufacturing, and more particularly to a method of forming a resistor within a thin vertically oriented semiconductor body (Fin) as well as the semiconductor structure this is formed by the inventive method. The present invention also provides a method of controlling the resistance of a plurality of vertically oriented semiconductor bodies as well as a method to eliminate the nominal variation on the Fin thickness from the variation on threshold voltage.

Over the past twenty-five years or so, the primary challenge of very large scale integration (VLSI) has been the integration of an ever-increasing number of metal oxide semiconductor field effect transistor (MOSFET) devices with high yield and reliability. This was achieved mainly in the prior art by scaling down the MOSFET channel length without excessive short-channel effects. As is known to those skilled in the art, short-channel effects are the decrease of threshold voltage Vt in short-channel devices due to two-dimensional electrostatic charge sharing between the gate and the source/drain diffusion regions.

To scale down MOSFET channel lengths without excessive short-channel effects, gate oxide thickness has to be reduced while increasing channel-doping concentration. However, Yan, et al., "Scaling the Si MOSFET: From bulk to SOI to bulk", IEEE Trans. Elect. Dev., Vol. 39, p. 1704, July 1992, have shown that to reduce short-channel effects for sub-0.05 µm MOSFETs, it is important to have a backside-conducting layer present in the structure that screens the drain field away from the channel. The Yan, et al. results show that double-gated MOSFETs and MOSFETs with a top gate and a backside ground plane are more immune to short-channel effects and hence can be scaled to shorter dimensions than conventional MOSFETs.

The structure of a typical prior art double-gated MOSFET consists of a very thin vertical Si layer (Fin) for the channel, with two gates, one on each side of the channel. The term "Fin" is used herein to denote a semiconducting material which is employed as the body of the FET. The two gates are electrically connected so that they serve to modulate the channel. Short-channel effects are greatly suppressed in such a structure because the two gates very effectively terminate the drain field line preventing the drain potential from being felt at the source end of the channel. Consequently, the variation of the threshold voltage with drain voltage and with gate length of a prior art double-gated MOSFET is much smaller than that of a conventional single-gated structure of the same channel length.

Resistors are devices that have electrical resistance associated therewith. Resistors are typically employed in an electrical device for protection, operation and/or current control. Hence, resistors play an important part in current analog and digital circuit designs. To date, however, there are no known Fin structures that include a resistor built within the Fin of the structure. Using a Fin-based technology would require a redesign of current CMOS (complementary metal oxide semiconductor) resistor schemes for buried resistors (BRs), overpass resistors (Ops) and silicide resistors.

In view of the above, there is a need for providing Fin structures which include a resistor built within the thin vertical semiconductor body of the structure that do not require redesign of current CMOS resistor schemes.

BRIEF SUMMARY OF THE INVENTION

One object of the present invention is to provide a method of fabricating a Fin structure having a resistor formed within a thin vertically oriented semiconductor body of the Fin structure.

A further object of the present invention is to provide a method of fabricating a Fin structure having a resistor formed within a thin vertically oriented semiconductor body of the Fin structure that can be easily implemented with various CMOS resistor design layouts such as burled resisters, overpass resistors and silicide resistors.

An even further object of the present invention is to provide a method of controlling the resistance of a plurality of vertically oriented semiconductor bodies.

A yet even further object of the present invention is to provide a method which is capable of eliminating the nominal variation on the Fin thickness from the variation on threshold voltage.

These and other objects and advantages are achieved in the present invention by utilizing an off-axis implant step to implant dopant ions into exposed vertical surfaces of a thin vertically oriented semiconductor body of a Fin structure such that the concentration and energy employed during the implant step is sufficient enough to penetrate into the surface of the vertically oriented semiconductor body without saturating the semiconductor body.

Specifically, and in one aspect, the present invention relates to a method of forming a resistor within a Fin structure. Specifically, the method of forming the resistor in such a structure includes the steps of:

forming at least one vertically oriented semiconductor body having exposed vertical surfaces on a substrate;

implanting dopant ions into said exposed vertical surfaces of said at least one semiconductor body off-axis at a concentration and energy sufficient to penetrate into said exposed vertical surfaces of said at least one semiconductor body without saturation; and forming contacts to said at least one semiconductor body.

The above processing steps result in the formation of a Fin structure which includes a resistor present within the at least one vertically oriented semiconductor body. Specifically, the inventive Fin structure comprises:

a structure having at least one vertically oriented semiconductor body present thereon, wherein said at least one vertically oriented semiconductor body has vertical surfaces;

a doped region present in said at least one vertically oriented semiconductor body that extends inward from said vertical surfaces; and contacts present on outer portions of said at least one vertically oriented semiconductor body.

In some embodiments of the present invention, the structure includes a masking layer which protects predetermined portions of said at least one vertically oriented semiconductor body, while leaving said contacts exposed. It is noted that the resistor element of the present invention includes the doped region as well as the contacts which are formed within the semiconductor body of the structure.

Another aspect of the present invention relates to a method of controlling the resistance of a plurality of vertically oriented semiconductor bodies, each having exposed surfaces and different widths. Specifically, this aspect of the present invention comprises the steps of:

forming a structure having a plurality of vertically oriented semiconductor bodies on a substrate, each of said bodies having exposed vertical surfaces and differing widths; and implanting dopant ions off-axis into said plurality of vertically oriented semiconductor bodies at a concentration and energy sufficient to penetrate into exposed vertical surfaces of said plurality of vertically oriented semiconductor bodies without saturating each semiconductor body.

In some embodiments, an activation-annealing step follows the implant step so as to diffuse the dopant ions from the vertical surfaces of each semiconductor body. In such cases, the thicker semiconductor bodies have a first dopant concentration and thinner semiconductor bodies have a second dopant concentration, wherein the first dopant concentration is lower than said second dopant concentration.

DETAILED DESCRIPTION OF THE INVENTION

Figure 1A:
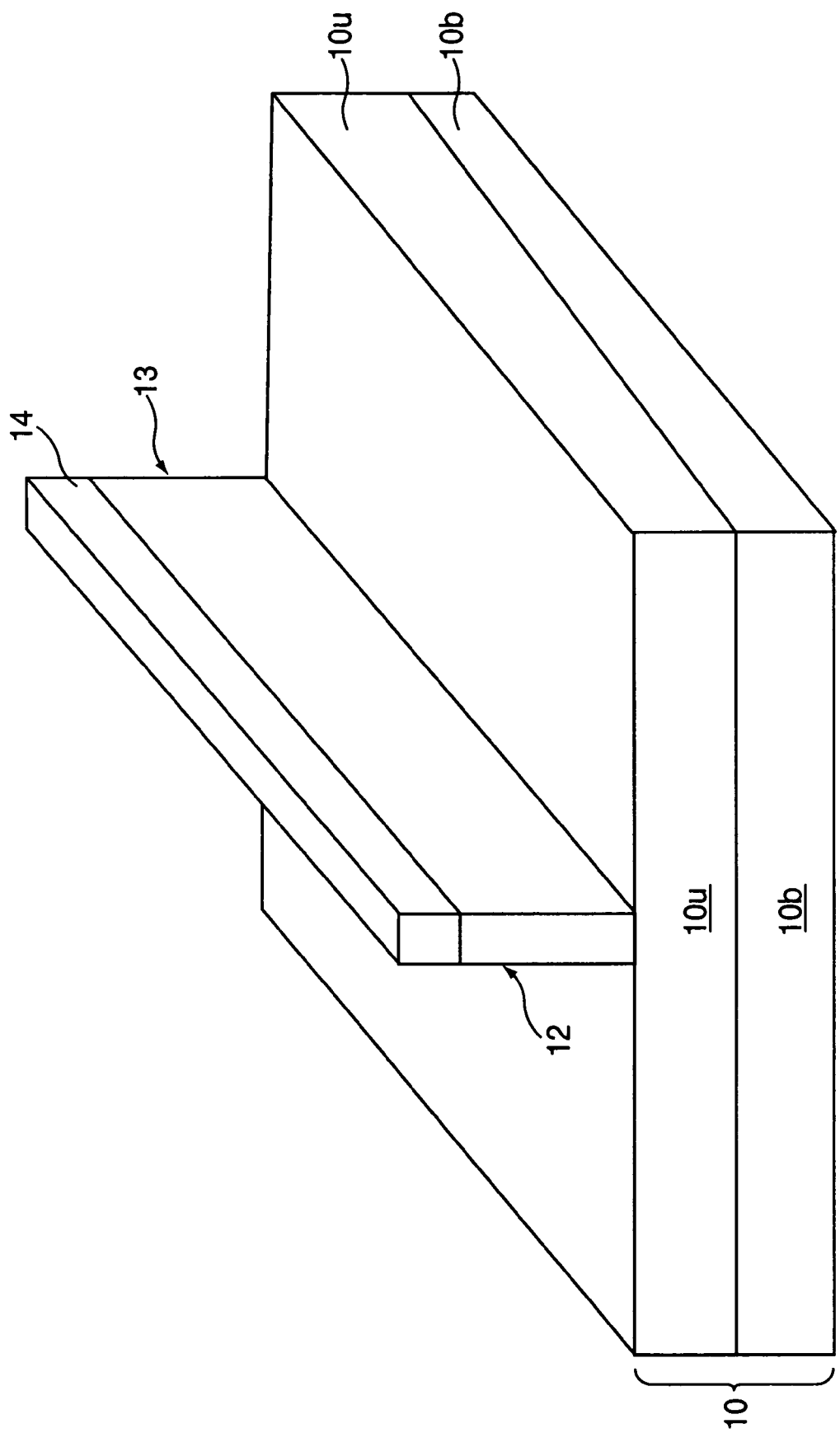
FIGS. 1A–1F are pictorial views showing the inventive integrated Fin/resistor structure through various processing steps of the present invention.

The present invention, which provides a method of fabricating a Fin structure which includes a resistor formed within a portion of at least one patterned vertically oriented semiconductor body, will now be described in greater detail by referring to the drawings that accompany the present application.

Reference is first made to FIGS. 1A–1F which illustrate various processing steps that are employed in the present invention in fabricating a Fin structure which includes a resistor formed within a portion of the Fin, i.e., the thin vertically oriented semiconductor body. FIG. 1A shows an initial structure that is employed in the present invention in fabricating the inventive integrated Fin/resistor structure. Specifically, FIG. 1A shows a structure that includes substrate 10 having a patterned stack comprising a semiconductor body region, i.e., Fin, 12, and hard mask 14 present atop substrate 10. It is noted that Fin 12 is a vertically oriented semiconductor body which includes exposed vertical surfaces and a top horizontal surface which is protected by hard mask 14. In FIG. 1A, reference numeral 13 denotes the exposed vertical surfaces of the Fin. Although the present invention shows only one patterned stack atop the substrate, the inventive method works well in cases where a plurality of patterned stacks having the same or different widths are present atop the surface of substrate 10.

The substrate includes upper portion 10u which is comprised of an insulating material such as an oxide, nitride, oxynitride or multilayers thereof, and bottom portion 10b which is comprised of a semiconducting material such as Si.

Note that regions 10 and 12 may be part of an SOI (silicon-on-insulator) material wherein region 10u is a buried oxide layer which is sandwiched between semiconducting materials 10b and 12. Alternatively, layers 10u and 12 are layers which are separately deposited atop a semiconductor substrate.

The semiconductor body, i.e., Fin region 12, is comprised of any semiconducting material such as single crystalline Si or SiGe and the hard mask is comprised of an oxide, nitride, oxynitride or multilayers thereof. The vertical thicknesses of semiconductor material layer 12 (i.e., Fin 12) and the hard mask are not critical to the present invention. Typically, semiconductor body 12 has a vertical thickness of from about 300 to about 2000 Å, whereas the hard mask has a vertical thickness of from about 100 to about 1000 Å.

The structure shown in FIG. 1A is fabricated utilizing conventional processes well known to those skilled in the art. For example, hard mask 14 is formed atop a layer of semiconducting material by utilizing a conventional deposition process such as chemical vapor deposition (CVD), plasma-assisted CVD, or chemical solution deposition. Alternatively, hard mask 14 may be grown on semiconductor body 12 (i.e., Fin 12) utilizing a conventional thermal oxidation, nitridation or oxynitridation process well known to those skilled in the art.

Following formation of the hard mask material on semiconductor body 12, the structure is subjected to conventional lithography (including applying a photoresist to the hard mask, exposing the photoresist to a pattern of radiation, and developing the pattern into the photoresist using a conventional resist developer) and dry etching such as reactive-ion etching, ion beam etching, plasma-etching or laser ablation. The etching step may include a single etching process or multiple etching processes using one or more of the above mentioned dry etching processes may be employed to provide the structure illustrated in FIG. 1A. After etching, the photoresist is removed from the structure utilizing a conventional stripping process well known to those skilled in the art.

Figure 1B:
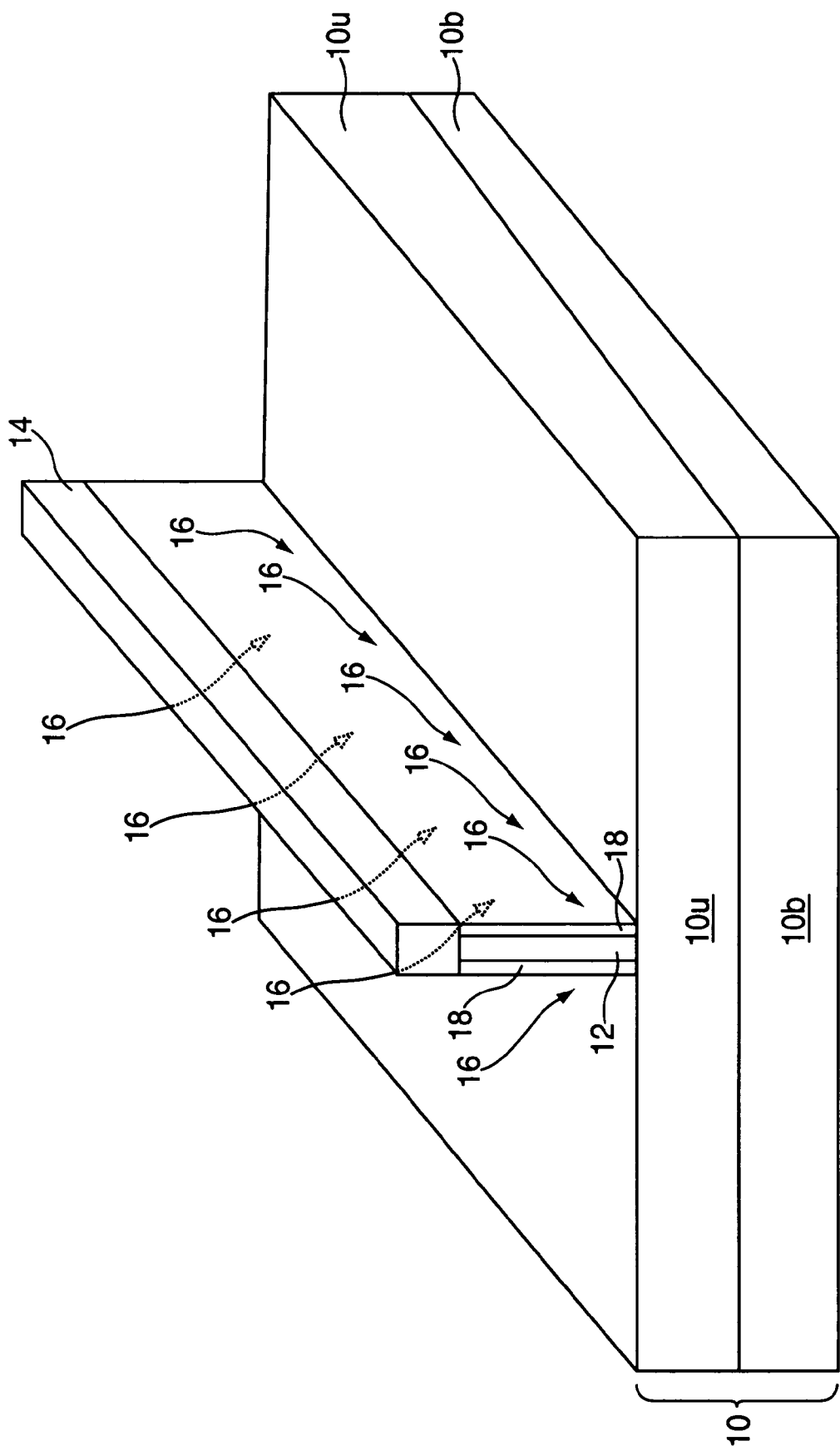

With hard mask 14 protecting the top horizontal surface of vertically oriented semiconductor body 12, i.e., the Fin, the structure shown in FIG. 1A is then subjected to an off-axis implant step where dopant ions (labeled as 16) are implanted into the exposed vertical surfaces of the semiconductor body to form doped region 18 within the semiconductor body. This step of the present invention is shown in FIG. 1B. Note that this doped region extends inward from the vertical surfaces of the semiconductor body and that the doped region together with the contacts regions to be subsequently formed form the resistor of the present invention. Specifically, doped region 18 is formed in each exposed vertical surface of the semiconductor body using implant conditions in which the dopant concentration and implant energy is sufficient to penetrate into the exposed vertical surfaces of the semiconductor body without saturating the semiconductor body.

It is noted that the phrase "deep enough to penetrate the surface of the semiconductor body, without saturating the semiconductor body" denotes that the dopant ions used in the above-identified implant step are not implanted entirely through the semiconductor body. Hence, in the off-axis implant step of the present invention, the dopant ions are implanted so as to form implant regions which are predominately located near the vertical sidewalls of the semiconductor body; the implant regions do not extend into the interior portion of the semiconductor body. With very thin Fins, it would be quite easy to implant dopant ions such that the Fin has a fairly uniform dopant concentration all the way through the Fin ("saturated Fin"). However, saturated thin Fins would result in a resistor whose resistance is heavily dependent on Fin thickness. A low energy, off-axis implant would result in a vertical skin of doped semiconductor body on the outside surface of all Fins. The depth and concentration of those "skins" would all be approximately equal, resulting in a substantially identical total dopant dose in each Fin. However, after annealing, the thicker Fins would have that dopant dose distributed over a thicker Fin, resulting in a lower final dopant concentration. The thinner Fins would have the same identical dose distributed less over the thin semiconductor body, resulting in a higher concentration. Hence, the implant step of the present invention removes thickness dependence from the resistance.

Specifically, an angled implant is performed at a low energy so that the doped region stops at a predetermined point within the semiconductor body. This compensates the dependence of resistance on Fin thickness. The angled implant performed in the present invention works well to modulate resistivity as a function of Fin thickness. A very low energy angled implant is first performed to deposit a fixed concentration of dopant ion into a very shallow surface on the sidewalls of the Fin. The Fins are then annealed to disperse the dopant through the Fin. In a thicker than nominal Fin, the dopant can diffuse further in resulting in a lower than nominal bulk dopant concentration over a thicker than nominal Fin. In a thinner than nominal Fin, the dopant has nowhere to diffuse to, resulting in a higher than nominal bulk dopant concentration, in a thinner than nominal Fin. Since resistance is determined (in a linear direct proportionality) by both resistivity (determined by dopant concentration) and cross sectional area (of which thickness is a component), both Fins will have nearly the same resistance per unit length. Thus, this step of the present invention eliminates the nominal process variation on Fin thickness from the variation on Fin resistance.

This technique also allows one to more heavily dope the "bodies" of thinner than nominal Fins, and more lightly dope the "bodies" of thicker than nominal Fins. The threshold voltage and subthreshold conduction of a symmetric gate Fin (both gate electrodes having the same workfunction) are both determined, in a different manner than above, by the same two parameters. Thus, this off-axis implant step of the present invention also serves to eliminate the nominal process variation on Fin thickness from the variation on threshold voltage.

In accordance with the present invention, the angled implant used in forming doped region 18 is performed such that the projected range of implant is typically ¼ of the way through the Fin. The dose of the implant can be used to adjust the resulting nominal resistance. It is noted that the dopant ion employed at this point of the present invention may be either an n-type dopant or a p-type dopant.

This implant step may be carried out using a maskless or masked ion implantation process. When a masked ion implantation process is employed in the present invention, the exposed surface of substrate 10 is protected by a mask that is capable of preventing the dopant ions from penetrating into the exposed surface of substrate 10.

In practice this implant step can be carried out as follows. For the nFET a boron difluoride species would be implanted at a dose between 8 E 11 and 4 E 12 per cm2 (that is, between 8 times 10 to the 11 th power and 4 times 10 to the 12 th power per square centimeter on the fin surface). For the pFET an arsenic species would be implanted at a dose between 5 E11 and 2 E 12 per cm2. For a resistor an arsenic species would be implanted at a dose between 5 E 14 and 2 E 15 per cm2. These doses vary as a function of desired threshold voltage and the gate oxide thickness of the device. In all cases the implant energy would be between 0.8 and 10 Kev. The lower end of the energy range would be for Fins with thicknesses in the range of 2 to 5 nm; thicker Fins would be implanted at higher energy settings. In all cases the implants would be carried out at angles of between 20 and 45 degrees off vertical, and would be carried out in two separate steps to implant each side of the Fin.

Following the angled implant step, the structure is subjected to a conventional activation annealing process which serves to diffuse the dopant ions through the Fin to a predetermined depth which is dependent on the thickness of the Fin as well as the concentration of the dopant ion. Specifically, the activation annealing step is performed in an inert atmosphere such as He, Ar or a mixture thereof at a temperature of about 700° C. or higher for a time period of about 1 minute or greater. More preferably, the activation annealing is performed at a temperature of from about 800° to about 1050° C. for a time period of from about 2 seconds to about 20 minutes.

Figure 1C:
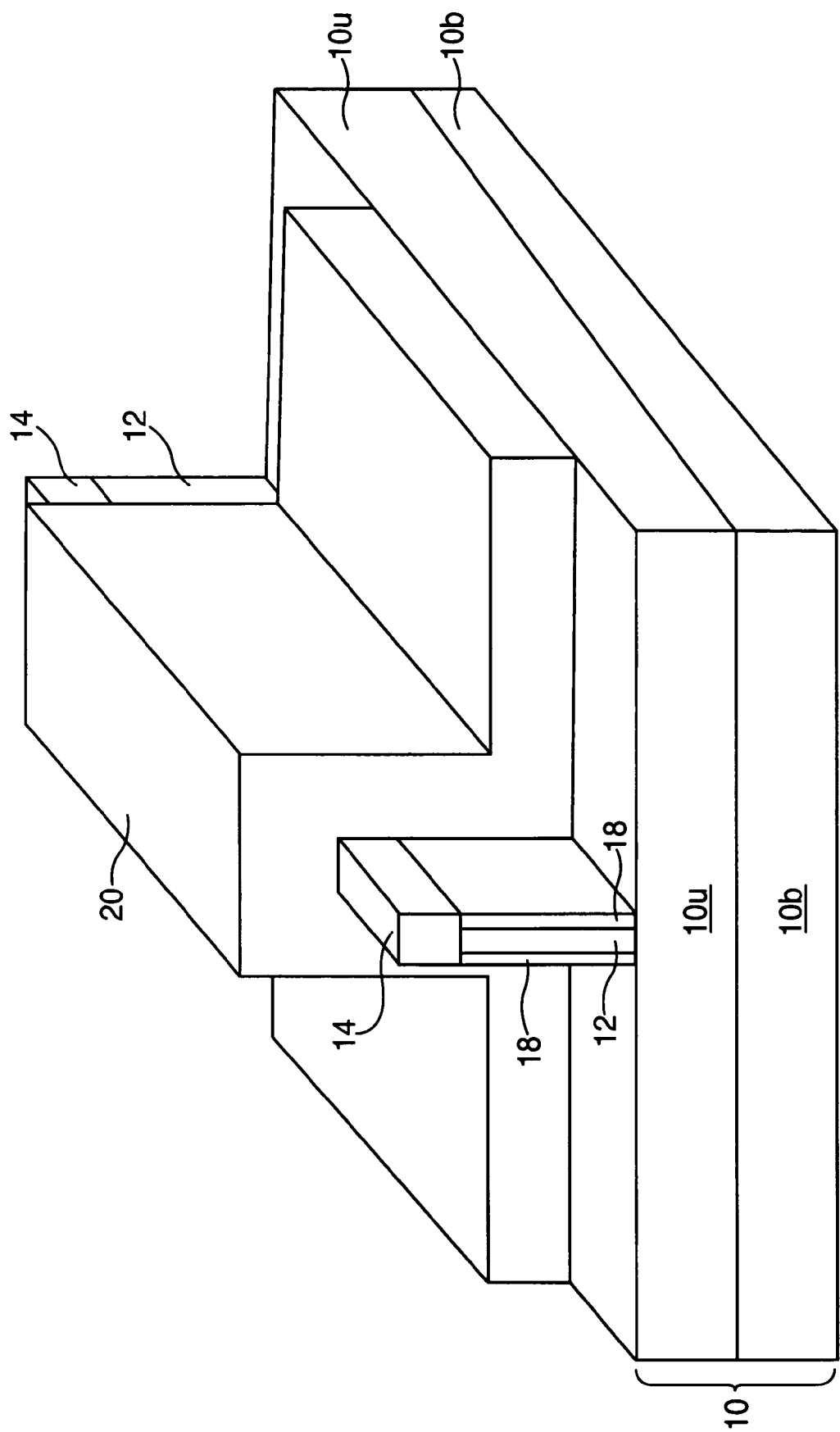
Figure 1D:
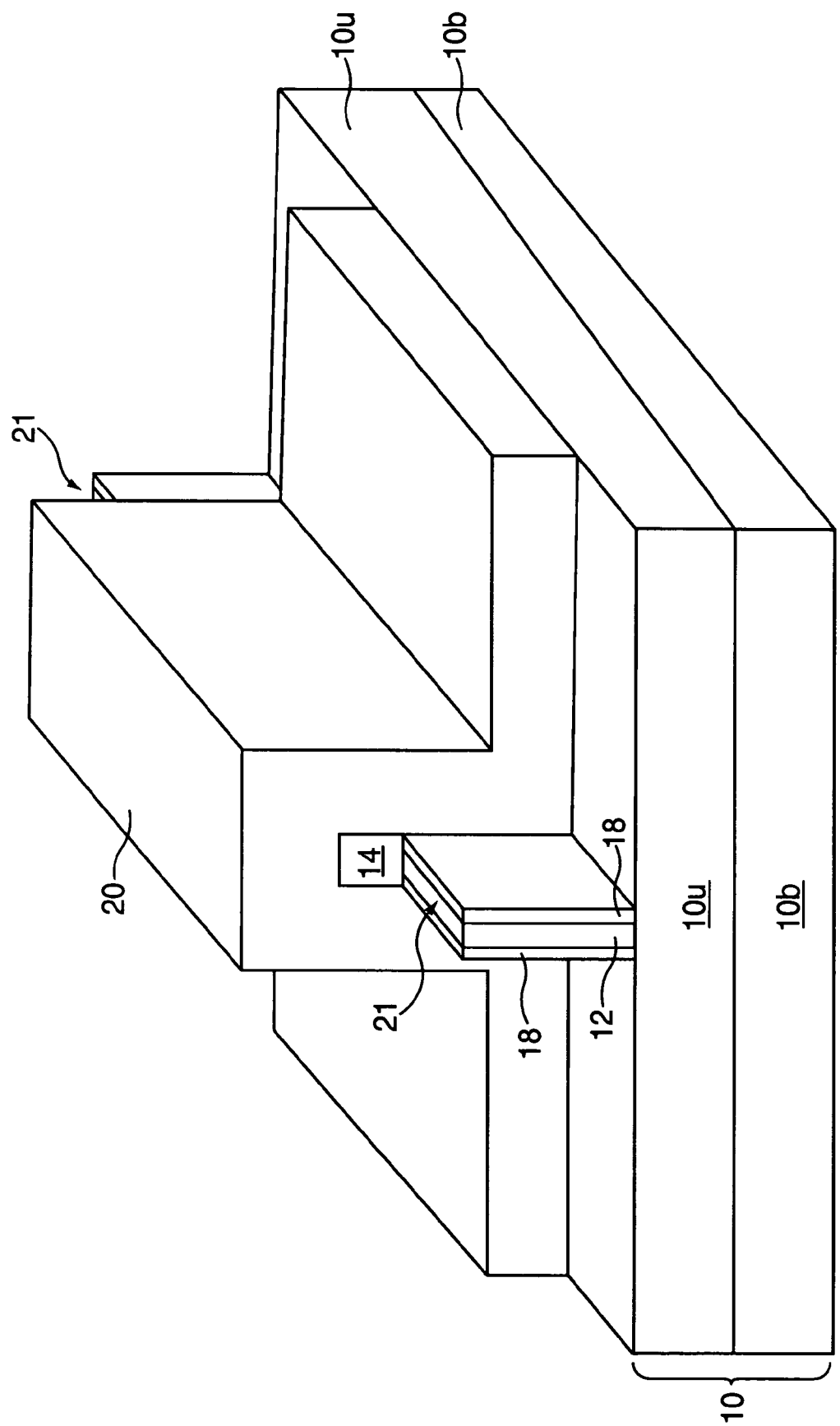

Next, patterned masking layer 20 is formed atop a portion of the structure shown in FIG. 1B so as to provide the structure shown, for example, in FIG. 1C. Note this resultant structure still contains the patterned stack (hard mask 14 and semiconductor body 12) and that patterned masking layer 20 protects a portion of the patterned hard mask and semiconductor body, while leaving end portions of the patterned stack exposed.

Specifically, the masking layer which is composed of a conductive material or a non-conductive material such as a nitride is formed atop the entire structure shown in FIG. 1B utilizing a conventional deposition process well known to those skilled in the art. A photoresist, not shown, is applied to the masking layer, and conventional lithography and etching are employed in forming the patterned masking layer. After the etching step, the photoresist is removed from the structure providing the structure illustrated in FIG. 1C.

At this point of the inventive process, the hard mask not protected by the patterned masking layer is removed from the structure utilizing a conventional etching process which is selective in removing the hard mask from the structure. The resultant structure that is formed after portions of the hard mask have been removed from the structure is shown, for example, in FIG. 1D. Note that the structure shown in FIG. 1D has end portions 21 of semiconductor body 12 that are not protected by patterned masking layer 20 which are exposed.

Figure 1E:
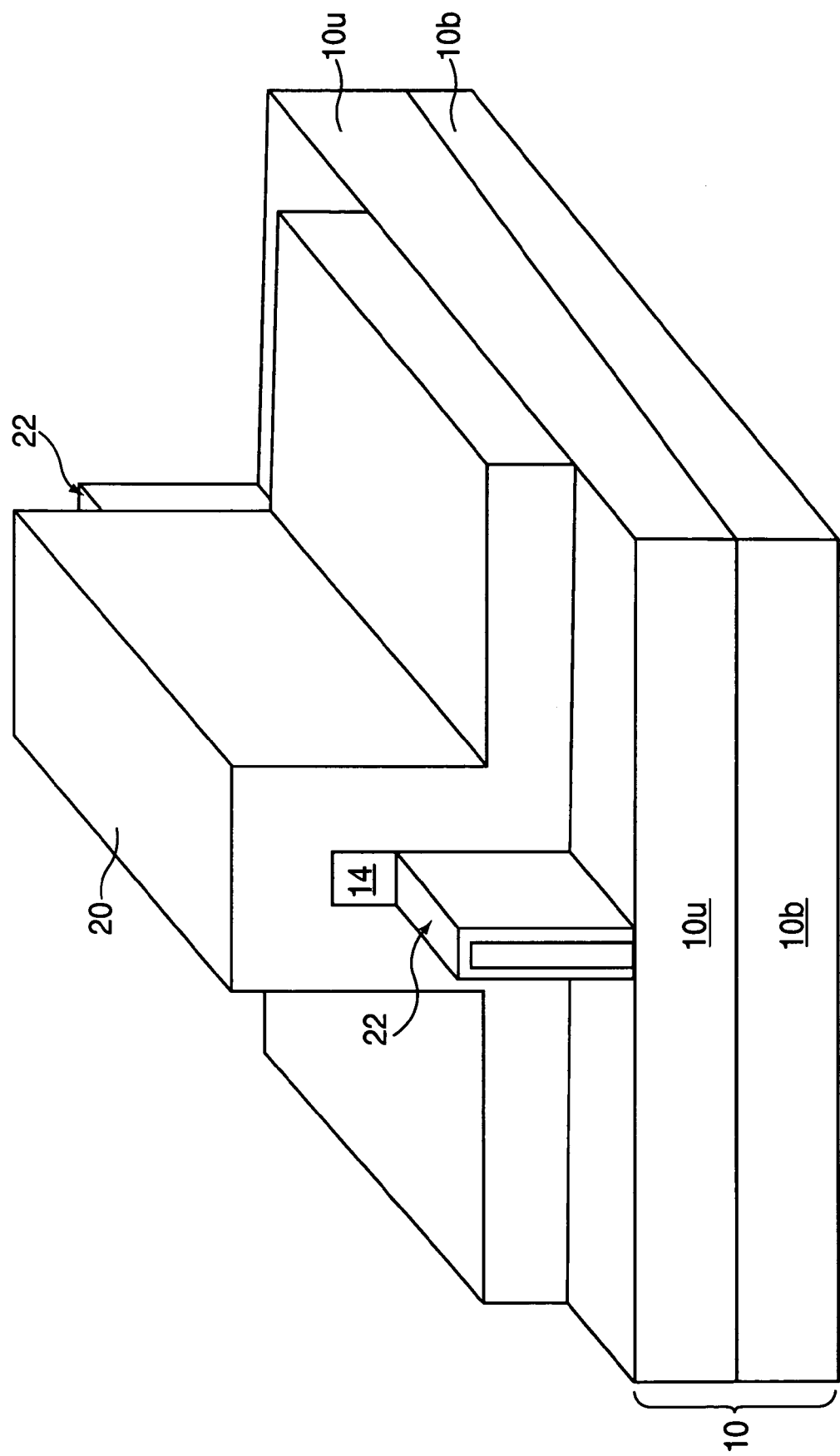

After removing portions of the hard mask from atop the semiconductor body, contacts 22 such as shown in FIG. 1E are formed into the exposed end portions (labeled as 21 in the drawings) of the semiconductor body by ion implantation or silicidation. It is also contemplated in the present invention to form one contact through ion implantation and to form the opposing contact of the semiconductor body via silicidation.

When ion implantation is employed in forming contacts 22 into exposed end portions 21 of semiconductor body 12, the doping at this point of the present invention may be n-type or p-type. Alternatively, one exposed end portion of the semiconductor body may be doped with an n-type dopant, while the other exposed end portion of the semiconductor body may be doped with a p-type dopant. When contacts 22 are of the same dopant type which matches that of the previously formed doped region, a resistor is formed within the Fin. In cases wherein the exposed end portions of the semiconductor body are oppositely doped, the Fin contains a diode therein. In yet another possibility where one end contact having a heavily doped region of a first conductivity type is formed via ion implantation and the opposing end contact having a different conductivity as the first conductivity type is formed via silicidation, a Schottky diode is formed within the Fin.

The ion implantation employed at this point of the present invention is performed utilizing conventional ion implantation conditions well known to those skilled in the art. The ion implant energy and the dopant dosage used in forming the contacts may vary depending on the type of resistor element to be formed within the Fin.

The silicide contacts are formed using a conventional silicidation technique well known to those skilled in the art, including forming a refractory metal such as Ti, Co, or W atop an exposed portion of the semiconductor body, heating the structure to a temperature sufficient to transform at least at portion of the region containing the refractory metal and exposed semiconductor body to a silicide, and, if needed, removing any unreacted refractory metal from the structure utilizing a conventional wet chemical etchant. Typically, the silicide is formed by heating the refractory metal/semiconductor body region to a temperature of about 550° C. or greater for a time period of from about 30 seconds or greater. The silicidation is typically, but not always, carried out in the presence of an inert gas atmosphere such as He, Ar or a mixture thereof. In some embodiments, nitrogen may be used during the silicidation process. The use of a nitrogen ambient during silicidation is particularly employed when the refractory metal is Ti. In such a Ti silicidation process, TiN forms.

In embodiments wherein various dopants are employed, or in instances were combined ion implantation and silicidation is employed, one of the exposed regions of the semiconductor body may be protected by a mask during the formation of one of the contacts, and thereafter the mask is removed and a new mask is formed over the newly formed contact area. The second contact is formed and thereafter the new mask is removed from the structure.

In an optional embodiment of the present invention, the patterned masking layer is removed from the structure utilizing a conventional etching process which is highly selective in removing the masking layer from the structure. The structure formed after this optional embodiment of the present invention is shown, for example, in FIG. 1F.

Figure 1F:
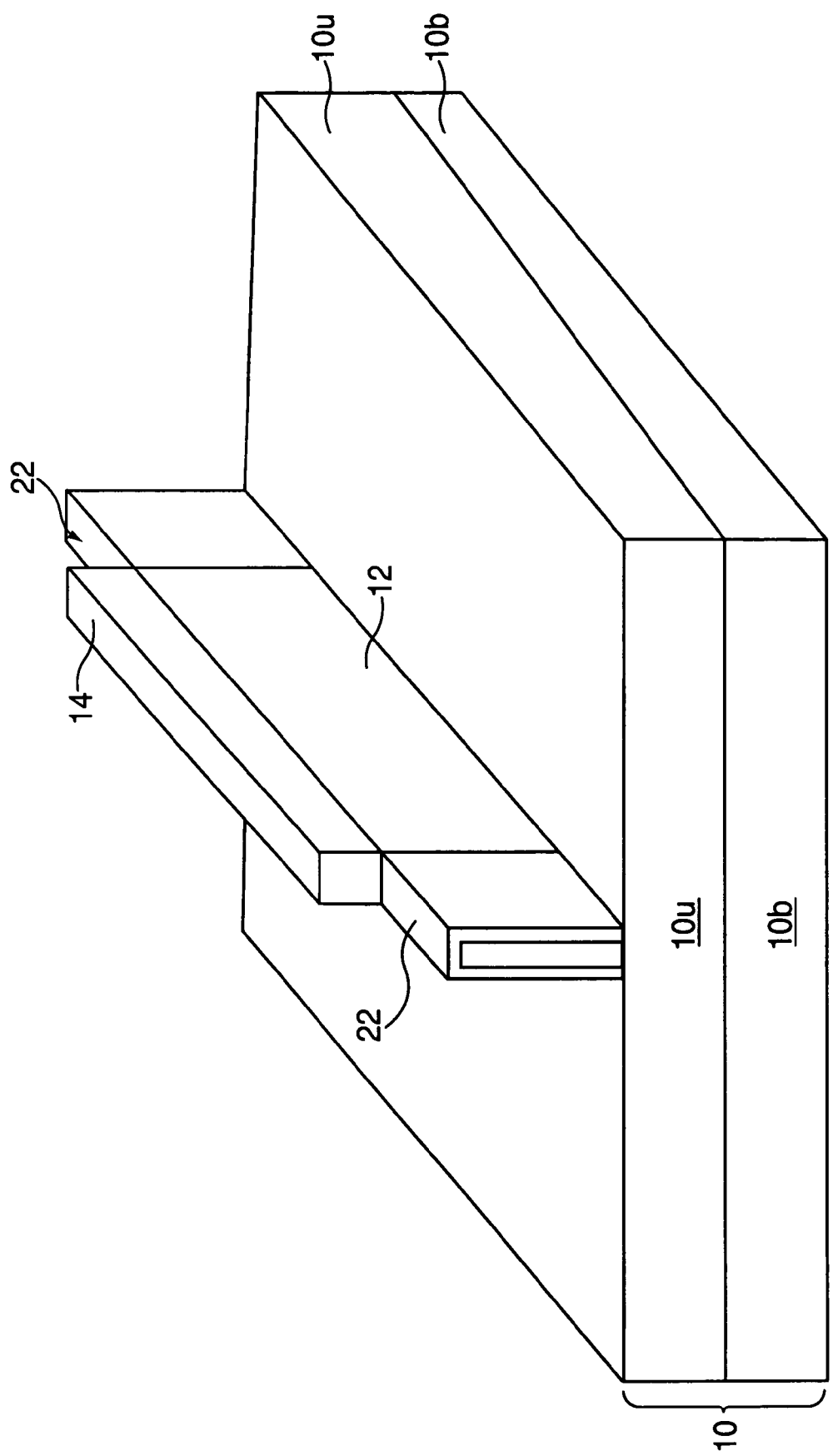

Connectors, not shown in this particular set of drawings, may be formed to either the structure shown in FIG. 1E or 1F utilizing conventional techniques including deposition of a conductive material and patterning. The connectors are formed to the contact regions so as to provide a passive semiconductor device.

Figure 2:
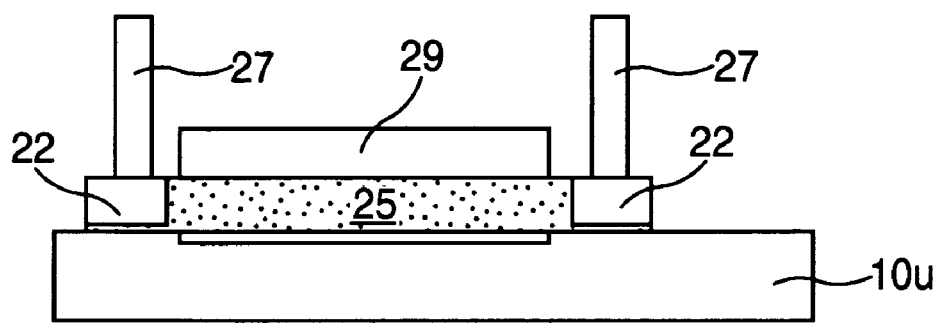
FIGS. 2–3 are pictorial representations (thorough a cross-sectional view) showing various resistor layouts of the inventive Fin structure.
Figure 3:
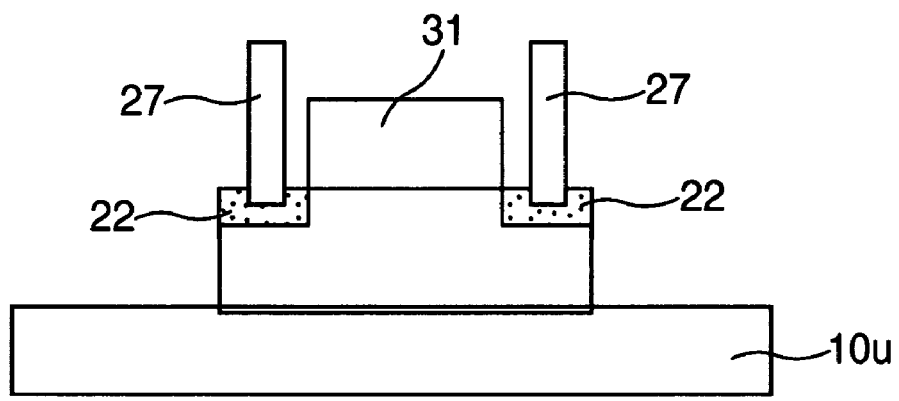
Figure 4:
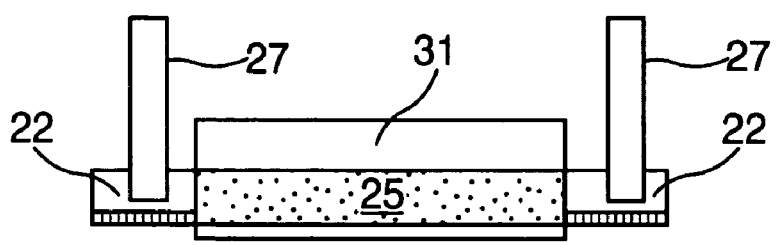
FIG. 4 is a pictorial representation (through a cross-sectional view) showing an alternative resistor layout of the present invention.

FIGS. 2–3 are pictorial representations (thorough a cross-sectional view) showing various resistor layouts of the inventive Fin structure that are formed utilizing the above mentioned processing steps. In these drawings, reference numeral 22 represents contacts, reference numeral 25 is the doped Fin region, reference numeral 10u represents the insulator region of the substrate, reference numeral 27 represents the connectors, reference numeral 29 represents a conductive masking layer and reference numeral 31 represents a nitride masking layer. Specifically, FIG. 2 represents a Fin buried resistor layout; while FIG. 3 represents a Fin OP poly resistor layout. FIG. 4 is a pictorial representation (through a cross-sectional view) showing an alternative resistor layout of the present invention in which an OP diffusion resistor layout is employed.

The OP poly resistor is formed by blocking the silicidation of the middle part of the semiconductor body. By defining an OP shape, the semiconductor body will still see the source/drain implant of choice (i.e., n or p dopant), but the silicide will not form where the OP shape is defined due to the blocking nitride mask. The OP diffusion resistor is formed in nearly the same way as the BR; however, the BR will receive a different set of implants from the OP resistor. The OP resistor will see the standard source/drain implants. In the OP implementations, a nitride forms the blocking mask. In the BR implementations, a conductive material forms the blocking mask.

It should be noted that the inventive Fin structure may be used as a component of a field effect transistor (FET) that employs the inventive Fin structure as the current carrying channel of the FET. The FET structure is formed using conventional processing steps that are typically used in forming a FinFET structure.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A Fin structure comprising:
   a structure having at least one vertically oriented semiconductor body present thereon, wherein said at least one vertically oriented semiconductor body has vertical surfaces;
   a doped region, comprised of a concentration of dopant ions, present in said at least one vertically oriented semiconductor body that extends inward from said vertical surfaces, wherein said dopant ions are diffused into said semiconductor body to a predetermined depth that is dependent on the thickness of the semiconductor body and the concentration of the dopant ions; and
   contacts present on outer portions of said at least one vertically oriented semiconductor body, wherein said doping region and said contacts are of the same dopant type thereby providing a resistor in said at least one vertically oriented semiconductor body.

2. The Fin structure of claim 1 wherein said at least one vertically oriented semiconductor body is comprised of single crystalline Si or SiGe.

3. The Fin structure of claim 1 wherein said at least one vertically oriented semiconductor body has a hard mask present atop a horizontal surface.

4. The Fin structure of claim 1 wherein said at least one vertically oriented semiconductor body has a patterned masking layer thereon, said patterned masking layer not covering said contacts.

5. The Fin structure of claim 4 wherein said patterned masking layer is comprised of a conductive material.

6. The Fin structure of claim 5 wherein said patterned masking layer is comprised of a non-conductive material.

7. A Fin structure according to claim 1, wherein said contacts comprise further doped regions fomied in upper, horizontal surfaces of the semiconductor body and laterally extending thereacross.

8. A Fin structure according to claim 1, wherein:
   said doped region includes:
   i) a first doped portion of the semiconductor body extending inward from a first vertical surface of the semiconductor body; and ii) a second doped portion of the semiconductor body extending inward from a second vertical surface of the semiconductor body; and the semiconductor body includes an undoped portion laterally extending between and separating said first and second doped portion.

9. A Fin structure comprising:

a structure having at least one vertically oriented semiconductor body present thereon, wherein said at least one vertically oriented semiconductor body has vertical surfaces;

a doped region, comprised of a concentration of dopant ions, present in said at least one vertically oriented semiconductor body that extends inward from said vertical surfaces, wherein said dopant ions are diffused into said semiconductor body to a predetermined depth that is dependent on the thickness of the semiconductor body and the concentration of the dopant ions; and contacts present on outer portions of said at least one vertically oriented semiconductor body, wherein said doping region and one of said contacts are of opposite dopant type thereby providing a diode in said at least one vertically oriented semiconductor body.

10. The Fin structure of claim 9 wherein said diode includes said contacts that are of opposite dopant style.

11. The Fin structure of claim 9 where said diode includes said contacts wherein one of the contacts comprises a doped region having a conductivity type dopant which is different from said dopant region and the other contact is a silicide.

* * * * *